US008729665B2

(12) United States Patent
Klootwijk et al.

(10) Patent No.: US 8,729,665 B2
(45) Date of Patent: May 20, 2014

(54) INTEGRATION SUBSTRATE WITH A ULTRA-HIGH-DENSITY CAPACITOR AND A THROUGH-SUBSTRATE VIA

(75) Inventors: Johan H. Klootwijk, AG Eindhoven (NL); Freddy Roozeboom, AG Eindhoven (NL); Jaap Ruigrok, AG Eindhoven (NL); Derk Reefman, AG Eindhoven (NL)

(73) Assignee: IPDIA, Caen (FR)

( * ) Notice: Subject to any disclaimer, the term of this patent is extended or adjusted under 35 U.S.C. 154(b) by 1178 days.

(21) Appl. No.: 12/599,494

(22) PCT Filed: May 8, 2008

(86) PCT No.: PCT/IB2008/051824
§ 371 (c)(1),
(2), (4) Date: May 19, 2010

(87) PCT Pub. No.: WO2008/139393
PCT Pub. Date: Nov. 20, 2008

(65) Prior Publication Data
US 2010/0244189 A1  Sep. 30, 2010

(30) Foreign Application Priority Data
May 10, 2007  (EP) .................................. 07107974

(51) Int. Cl.
*H01L 21/02* (2006.01)
(52) U.S. Cl.
USPC ............ 257/532; 257/E21.011; 257/E29.342; 438/386
(58) Field of Classification Search
USPC ............ 257/532, E21.011, E29.342; 438/386
See application file for complete search history.

(56) References Cited

U.S. PATENT DOCUMENTS

| | | | |
|---|---|---|---|
| 6,261,895 B1 | 7/2001 | Adkisson et al. | |
| 2002/0030216 A1 | 3/2002 | Adkisson et al. | |
| 2007/0035030 A1 | 2/2007 | Horton et al. | |
| 2008/0291601 A1* | 11/2008 | Roozeboom et al. | 361/306.2 |
| 2008/0291603 A1* | 11/2008 | Matters-Kammerer | 361/313 |

FOREIGN PATENT DOCUMENTS

| | | |
|---|---|---|
| DE | 10358299 A1 | 7/2005 |
| EP | 1359607 A2 | 11/2003 |
| WO | 2004/114397 A1 | 12/2004 |
| WO | 2007/054858 A2 | 5/2007 |
| WO | 2007/132423 A2 | 11/2007 |

OTHER PUBLICATIONS

International Search Report for international application No. PCT/IB2008/051824, mailed Sep. 16, 2008 (3 pages).
Roozeboom, F. et al., "High-Density, Low-Loss MOS Capacitors for Integrated RF Decoupling," Int. J. Microcircuits and Electronic Packaging, 24(3), 2001, p. 182-196.

* cited by examiner

*Primary Examiner* — Marvin Payen
(74) *Attorney, Agent, or Firm* — Hamre, Schumann, Mueller & Larson, P.C.

(57) ABSTRACT

An integration substrate for a system in package comprises a through-substrate via and a trench capacitor wherein with a trench filling that includes at least four electrically conductive capacitor-electrode layers in an alternating arrangement with dielectric layers. —The capacitor-electrode layers are alternatingly connected to a respective one of two capacitor terminals provided on the first or second substrate side. The trench capacitor and the through-substrate via are formed in respective trench openings and via openings in the semiconductor substrate, which have an equal lateral extension exceeding 10 micrometer. This structure allows, among other advantages, a particularly cost-effective fabrication of the integration substrate because the via openings and the trench openings in the substrate can be fabricated simultaneously.

14 Claims, 4 Drawing Sheets

INTEGRATION SUBSTRATE WITH A ULTRA-HIGH-DENSITY CAPACITOR AND A THROUGH-SUBSTRATE VIA

FIELD OF THE INVENTION

The present invention relates to an integration device for a chip assembly such as a system-in-package. It further relates to a system-in-package containing an integration device, and to a method for fabricating an integration device.

The disclosure of EP05110488.3, PCT/IB2006/054063 (PH001923EP1), and of EP06113955.6 (PH005924EP1) is enclosed by reference in its entirety in the present application.

BACKGROUND OF THE INVENTION

Electronic devices often consist of several individually packaged integrated circuits (IC) for different functions, e.g., logic circuits for information processing, memory for storing information, and I/O circuits for information exchange with the outside world. A System-in-Package or SIP is a device that incorporates multiple chips, which make up a complete electronic system, into a single package. In the stacked chip assembly of System-in-Package, all of the individual chips are assembled in a single package, which allows space savings. Furthermore, SIP technology reduces the development costs for electronic application devices in comparison with System-on-chip technologies because different functionalities of the device can be assembled and updated in a modular manner. In three-dimensional die stacking, through-substrate vias are used for connecting different circuits on different chips.

In most electronic application devices, including for instance radio frequency devices and devices requiring DC-DC conversion, passive components like resistors, capacitors and inductors are an essential factor determining the size and cost of respective application devices. The large number of required passive components is a major factor in the assembly line production and yield. Therefore, an integration of passive components into a wafer has increasingly been considered as an alternative to basic surface mount device (SMD) components. In particular, the integration of high-density capacitors into a substrate has the advantage of allowing a miniaturization.

US 2002/0030216 A1 discloses a capacitor integrated into an interconnect stack of a chip. From F. Roozeboom et al., Int. J. Microcircuits and Electronic Packaging, 24(3)(2001), pp. 182-196, trench capacitors are known, which are integrated into a silicon substrate. A capacitance density between 20 and 100 nanofarad/square millimeter ($nF/mm^2$) can be achieved with this technology.

However, the integration of such trench capacitors with high capacitance densities into a passive integration device for a system in package requires a rather complicated processing and is therefore not cost-effective.

SUMMARY OF THE INVENTION

According to a first aspect of the invention, an integration device, for instance for a chip assembly such as a system in package, is provided. The integration device comprises:
 a semiconductor substrate with a first side and an opposite second substrate side;
 a through-substrate via extending from the first substrate side to the second substrate side of the semiconductor substrate,
 a trench capacitor in the semiconductor substrate; wherein the trench capacitor has a trench filling that includes a number of at least four electrically conductive capacitor-electrode layers in an alternating arrangement with dielectric layers, such that the different capacitor-electrode layers are electrically isolated from each other;
 the capacitor-electrode layers are connected to capacitor terminals provided on the first or second substrate side, and wherein
 the trench capacitor and the through-substrate via are formed in respective trench and via openings in the semiconductor substrate, which have an equal lateral extension exceeding 10 micrometer.

The integration device of the first aspect of the present invention has a high-density trench capacitor and a through-substrate via, formed in respective trench openings and via openings in the semiconductor substrate layer, which have an equal lateral extension exceeding 10 micrometer. In one embodiment, the equal lateral extension is a diameter of the trench opening, which has a cylindrical shape. In another embodiment, the lateral extension is a side length of a trench which, in a top view, has a rectangular or quadratic shape. In the case of a trench opening with an irregular shape, the equal lateral extension can be achieved by simultaneous formation of the trench openings under equal processing parameters, including material parameters of the integration device in the respective ranges of the trench openings for the through-substrate via and the capacitor.

The structure of the integration device allows a particularly cost-effective fabrication of the integration device because the via openings and the trench openings in the substrate can be fabricated simultaneously. This allows saving process steps otherwise required for separately fabricating the openings for through-substrate vias and for trench capacitors. Furthermore, the integration device of the present invention allows using standard, well-controlled deposition techniques such as low-pressure chemical vapor deposition (LPCVD) for the alternating sequence of electrically conductive capacitor-electrode layers and dielectric layers in the trench capacitor. This advantage adds to the cost-effectiveness of the present solution.

In addition, in comparison with SMD techniques, the integration of capacitors reduces the cost of processing, which would be required for fabricating and mounting a separate capacitor.

At the same time, the integration device of the first aspect of the invention allows achieving particularly high capacitance densities in a range heretofore unknown for trench capacitors integrated into an integration device. In some embodiments, the integrated trench capacitor has a capacitance density of more than 1 $\mu F/mm^2$.

In the trench capacitor of the first aspect of the invention, the capacitor-electrode layers are alternatingly connected to a respective of two capacitor terminals provided on the first or second substrate side. In other words, the capacitor-electrode layers are connected with their second nearest neighbor capacitor-electrode layer through a respective one of the two capacitor terminals. This way, a particularly high capacitance density is achieved. Therefore, while the different capacitor-electrode layers are electrically isolated from each other within the trench, two capacitor electrodes of the trench capacitor are formed by two respective groups of capacitor-electrode layers through their respective connections to one of the two capacitor terminals.

Under application of a voltage between neighboring capacitor-electrode layers a direct transport of charge carriers between the neighboring capacitor-electrode layers is avoided by the dielectric layers within the trench. However, capacitor-electrode layers are conductively connected via the capacitor terminals outside the trench.

In summary, by the synergy of the mentioned structural elements of the integration device of the first aspect of the invention, a very cost-effective solution, which is in particular suitable for applications requiring a high capacitance density, is provided.

In the following, further embodiments of the integration device of the present invention will be described. Unless stated otherwise, the embodiments described herein can be combined with each other.

In one embodiment, the at least one trench capacitor is formed in a first doped well of the semiconductor substrate. The provision of a well for the trench capacitor allows locally adapting the conductivity of the semiconductor substrate to the respective application case. Preferably, the semiconductor substrate is made of a high-ohmic semiconductor material. A high-ohmic semiconductor material is a semiconductor material with a resistivity larger than 1 kΩ·cm.

However, the semiconductor substrate can also be made of a low-ohmic semiconductor material. In this case, preferably, the capacitor-electrode layer that is closest to the semiconductor substrate is floating. In other words, this outermost capacitor-electrode layer, which is closest to a bottom and/or side wall of the opening, is not connected to any of the capacitor terminals. This layer shields the capacitor from the underlying low-ohmic substrate. A typical low-ohmic semiconductor material has a resistivity in the order of 100 mΩ·cm.

In one embodiment of the integration device that has a transistor integrated in the semiconductor substrate, which transistor is suitable for switching high voltages on the order of 10 V. Such transistors are required in power management applications. In another embodiment, the transistor is connected with the trench capacitor and configured to electrically connect or disconnect different capacitor electrode layers in respective switching states. This has the advantage of allowing to switch between different capacitor configurations, which can be realized using the capacitor-electrodes of one or more trench capacitors in the semiconductor substrate. In a variant, the transistor is connected so as to connect or disconnect, in respective switching states, the trench capacitor as a whole to circuitry provided on the semiconductor substrate or on an external chip.

This embodiment enables the integration of active devices such as transistors next to the passive components monolithically.

In a further embodiment, the dielectric layers of the trench capacitor are made of for instance $SiO_2$ or $Si_3N_4$ or silicon oxynitride. These materials are also used in other processes during the fabrication of integrated-circuit devices and are therefore compatible with well known and established processing technology. The integration-substrate of this embodiment is therefore particularly simple to introduce into an existing production line. Of course, other dielectrics, in particular higher-k dielectric layers such as PLZT and $TaO_2$ can be used as alternatives or in combination with standard materials, in particular for open through-wafer trenches. They can be deposited by known techniques, for instance by atomic layer deposition (ALD). But such high-k materials are not required in the present trench capacitor for achieving a high capacitance density. This an advantage over existing technologies in the semiconductor industry for integrated capacitors with high-capacitance densities. High-k materials require extra processing for their integration in order to avoid, for instance, incorporation of material traces from these materials as undesired impurities into other functional device layers. Many metal elements contained in high-k dielectrics are known to form undesired so called deep-level impurities in semiconductor materials such as silicon.

Similarly, the capacitor-electrode layers are preferably made of polycrystalline silicon (polysilicon). Polysilicon is another IC-compatible material that further simplifies the introduction of the integration device into a production process.

The lateral extension of the respective openings for the trench capacitor and the through-substrate via are in one embodiment even larger than 15 micrometer. In a further embodiment, their lateral extension exceeds 20 micrometer. This way, capacitors with a particularly high capacitance density can be fabricated. For the larger lateral extension allows fabricating the trench filling with a larger number of layers in the alternating layer sequence of electrically conductive capacitor-electrode layers and dielectric layers. A suitable maximum lateral extension that may be used is, assuming a circular trench shape, a trench diameter of 80 to 100 micrometer. Calculations show that the achievable capacitance density of a multi-layer capacitor begins to saturate beyond this lateral extension.

In one embodiment, the trench opening has an aspect ratio of at least 2. The aspect ratio is defined by a ratio of a depth extension of the trench opening in a depth direction from the first to the second substrate side on one hand, and of a lateral extension in a direction parallel to a main substrate surface on the first substrate side, on the other hand.

In another embodiment, the trench capacitor has a capacitance density of at least 500 nanofarad per square millimeter. A further embodiment has a trench capacitor with a capacitance density of at least 2 microfarad per square millimeter, suitably even 5 microfarad per square millimeter.

The trench capacitor of the integration device can be provided with a fixed (unchangeable) capacitance value or in form of a configurable capacitor, i.e., with a capacitance value that can be changed. In a further embodiment the integration device has both, a trench capacitor with a fixed capacitance and a trench capacitor with a configurable capacitance value.

In embodiments with a configurable trench capacitor in the semiconductor substrate
- the configurable trench capacitor has a trench filling that includes a number of at least four electrically conductive capacitor-electrode layers in an alternating arrangement with dielectric layers, such that the different capacitor-electrode layers are electrically isolated from each other;
- the capacitor-electrode layers are each connected to a respective allocated capacitor terminal provided on the first or second substrate side.

The structure of the configurable trench capacitor basically corresponds to that of the trench capacitor already described, except that each capacitor-electrode layer has its individual contact pad, so that different constellations of capacitor electrodes can be achieved, either fixed by hardwiring or by connected switching elements even during operation. In the case of hardwired connections between the contact pads, the integration device can be considered a fabrication platform suitable for a variety of applications, for which a respective suitable capacitor configuration can be selected.

One embodiment of the integration device with a configurable trench capacitor has a switching unit that comprises a plurality of switching elements such as transistors electrically interconnected between different capacitor-electrode layers of the trench filling of the configurable trench capacitor. The individual switching elements are configured to electrically connect, in a first switching state, two respective capacitor-electrode layers with each other, and to electrically disconnect, in a second switching state, the same two respective capacitor-electrode layers from each other, the switching elements having a control input terminal and being configured to assume either the first or the second switching state in dependence on a switch-control signal applied to the control input terminal.

Preferably, a control unit is also provided, which is connected with the switching unit and which is configured to generate and provide to the switching unit respective control signals for forming a respective one of a plurality of multi-capacitor configurations using the capacitor-electrode layers of the trench filling. Such an integration device may for instance form DC-to-DC-converter device or may be comprised by a DC-to-DC converter device. This allows to use a single supply voltage as an input to the integration device, which supply voltage can be transformed into different supply voltages at the output of the integration device, which supply voltages can be provided either in parallel or sequentially, using different DC-to-DC converters in the integration device. If only one configurable trench capacitor is used, it is also possible to provide different supply voltages sequentially by using the switching and control units to change the multi-capacitor configuration suitable for forming a DC-to-DC converter with a respective desired supply voltage.

The switching unit and the control unit can be integrated into the semiconductor substrate or provided on a different chip in a chip assembly such as a system-in-package that comprises the integration device.

Note that the semiconductor substrate of the integration device may form a part of a compound substrate. The compound substrate may for instance contain a support substrate of a different material, to which the semiconductor substrate is mounted According to a second aspect of the invention, a system-in-package is provided, which comprises an integration device according to the first aspect of the invention or one of its embodiments, which are described herein.

The system-in-package of the second aspect of the invention shares the advantages of the integration device of the first aspect of the invention. The system-in-package is a very cost-effective choice for any application that needs very high value capacitors on a small area scale.

According to a third aspect of the invention, a method for fabricating an integration device is provided. The method comprises providing a semiconductor substrate;
concurrently fabricating trench openings and via openings in the semiconductor substrate, which have an equal lateral extension exceeding 10 micrometer and extend from the first substrate side towards an opposite second substrate side of the semiconductor substrate;
fabricating a trench filling in the trench capacitor that includes a number of at least four electrically conductive capacitor-electrode layers in an alternating arrangement with dielectric layers, such that under application of a voltage between neighboring capacitor-electrode layers a direct transport of charge carriers within the trench between the neighboring capacitor-electrode layers is avoided;
fabricating capacitor terminals on the first or second substrate side and connecting the capacitor-electrode layers to a respective one of the capacitor terminals provided, and
fabricating a through-substrate via in the via opening.

The method of the present invention provides a cost effective fabrication process for an integration device that has a through-substrate via and a trench capacitor. The advantages of the method of the present aspect of the invention correspond to those described for the integration device of the first aspect of the invention.

Note that the fabrication of the through-substrate via can be performed at any step after the concurrent fabrication of the trench and via openings, i.e., it can be performed before the fabrication of the trench filling and of the capacitor terminals.

In one embodiment, the concurrent fabrication of trench openings and via openings comprises performing a deep reactive ion etching process for forming the trench openings and the via openings. Even though reactive ion etching is a single-wafer process, the time consumption of this process is reduced in comparison with known methods that use separate etching steps for the through-substrate vias and the trench capacitors.

Embodiments of the invention are also defined by the claims.

BRIEF DESCRIPTION OF THE DRAWINGS

These and other aspects of the invention will be apparent from and elucidated with reference to the embodiment(s) described hereinafter. In the following drawings

DETAILED DESCRIPTION OF EMBODIMENTS

Figure 1:
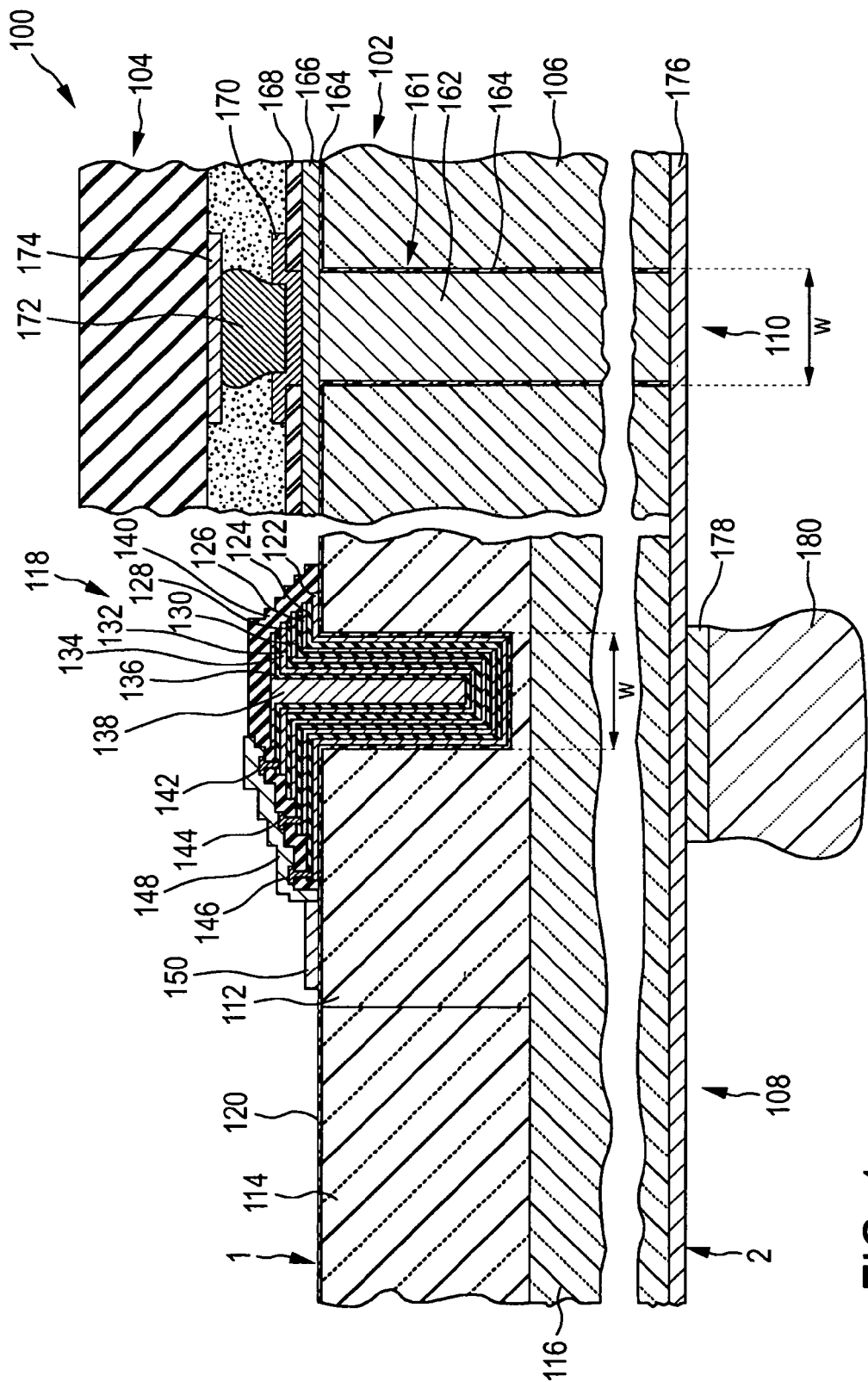
FIG. 1 shows a schematic cross sectional view of a stacked chip assembly comprising an integration device in the form of an integration substrate with an integrated trench capacitor and a through-substrate via, and an active die.

FIG. 1 shows a schematic cross sectional view of a stacked chip assembly 100 comprising an integration device in the form of an integration substrate 102 and an active die 104. The integration substrate 102 of this embodiment is based on a silicon substrate 106, and obtained from a high-ohmic silicon wafer. FIG. 1 shows two sections 108 and 110 of the integration substrate 102, which will also be referred to as the capacitor section 108 and the via section 110. Further details of the integration substrate are omitted, as are any details of the active die 104.

The following description will first turn to the capacitor section 108. In the capacitor section 108, doped wells 112 and 114 are provided on a first side 1 of the integration substrate. The depth of the doped wells 112 and 114 corresponds to that used in CMOS technology for providing regions of complementary conductivity. The well 112 serves for integration of a trench capacitor 118 into the integration substrate 102 and has a high-dose implantation to render the substrate part next to the trench capacitor 120 highly conductive ($n^{++}$). This substrate part can form a bottom electrode of the capacitor structure to be described below. The well 114 may be used for other integrated passive devices. A co-integration of active and passive devices in the integration substrate 102 is also possible.

The depth extension of the substrate 106 from the first substrate side 1 to the bottom of the wells 112 and 114 forms an example of a sufficient depth of the semiconductor substrate. Underneath the wells 112 and 114, a substrate region 116 extends to a second substrate side 2. Any high-ohmic material could be used in that region. However, it is particularly cost-saving to use techniques practiced in industrial fabrication lines. Therefore, a silicon substrate 106 provided with implanted wells 112 and 114 is preferred. The depth extension of the substrate region 116 is chosen suitably to provide sufficient mechanical stability. Typically, the final thickness of the integration substrate 102 is reduced in comparison with the initial thickness of the wafer used for fabricating the integration substrate. This can be achieved by thinning the wafer from the second substrate side 2.

In the well 112, a trench capacitor is 118 is arranged. The trench capacitor 118 is formed in a cylindrical trench 119. The trench 119 has a diameter of about 10 micrometer in the present embodiment. A first dielectric layer 120 separates the well 112 from the layers of the trench capacitor 118. The first dielectric layer 120 extends also on the surface of the integration substrate 102.

The trench capacitor has an alternating layer sequence of first to fifth electrically conductive polysilicon layers 122, 126, 130, 134, and 138, and first to fifth dielectric layers 120, 124, 128, 132, and 136. The complete lateral layer stack of this layer sequence forms a trench filling of the trench opening 119. The trench opening 119 has a lateral extension w. The first to fifth polysilicon layers form electrically conductive capacitor-electrode layers in the present embodiment. Neighboring polysilicon layers are electrically isolated from each other by a respective dielectric layer. The dielectric layers are made of $SiO_2$, $Si_3N_4$ or SiON (silicon oxynitride). Other embodiments use other suitable materials for the capacitor-electrode layers and the dielectric layers, which materials suitably are equally compatible with a front end technology used for fabrication of the integration substrate. In particular, compatibility of the layer materials with existing CMOS and BiCMOS technology is preferred.

The well, separated from polysilicon layer 122 by the dielectric layer 120, contributes to the capacitance of the trench capacitor as a further capacitor-electrode layer, unless in an embodiment (not shown), in which the first polysilicon layer 122, which is the one closest to the well 112, is left floating.

The polysilicon layers and the dielectric layers extend along the side and bottom walls of the trench opening 119 and therefore each have a shape corresponding to the letter "U", or, in other words and in consideration of the three-dimensional shape of the structure, corresponding to an open cylinder; except for the innermost polysilicon layer 138, which forms a filled cylinder to complete the trench filling. Alternative embodiments, which are not shown here, use different trench or layer geometries. Instead of a cylindrical trench, other trench forms with an elliptical, oval, or rectangular footprint may be used. In the corners between different side walls of the trench, the layer continuation can also be more or less curved instead of a sharp perpendicular corner.

The stack of capacitor-electrode layers and dielectric layers also extends along a section of the substrate surface on the first substrate side 1 on both sides of the trench. A step-pyramidal structure has been fabricated from the stack in the backend processing, leaving terraces for contact structures 142 to 146 that connect to the second and fourth capacitor-electrode layers 124 and 128, and to the well 112, respectively. The contact structures 142 to 146 are electrically interconnected by a first metallization layer 148 that merges into a first contact pad 150 arranged on the first substrate side and on the dielectric layer 120 and forming an internal terminal. Interlevel dielectric layers, summarized by reference label 140, cover the step-pyramidal surface of the trench capacitor except for contact openings, which are filled with the mentioned contact structures.

Figure 2:
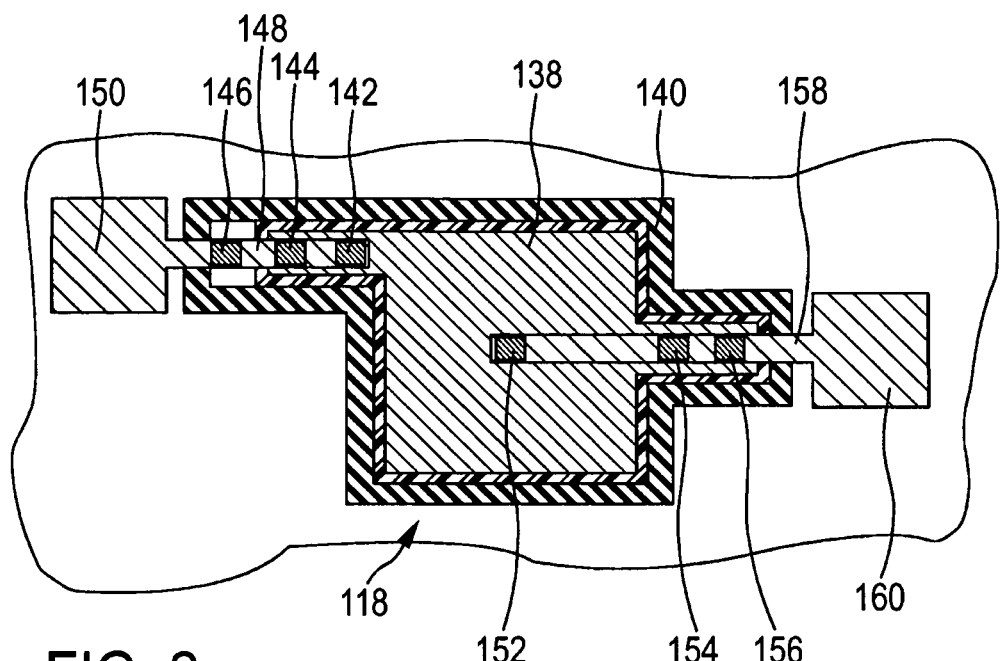
FIG. 2 shows a schematic top view of a trench capacitor in the integration substrate of FIG. 1.

In order to explain the complete contact arrangement of the trench capacitor 118, reference is now made in parallel to FIGS. 1 and 2. FIG. 2 shows a schematic top view of the trench capacitor 118 in the integration substrate 102 of FIG. 1. As can be seen in FIG. 2, additional contact structures 152 to 156 are provided on an opposite lateral side of the trench capacitor, the contact structures 152 to 156 are not visible in FIG. 1 because they are arranged with an offset to the sectional plane of in FIG. 1. The contact structures 152 to 156 connect to the remaining first, third and fifth capacitor-electrode layers 122, 126 and 130, and are electrically interconnected by a second metallization layer 158 that merges into a second contact pad 150, which like the first contact pad forms an internal terminal arranged on the first substrate side 1 and on the dielectric layer 120. The interlevel dielectric layers 140 are shown in FIG. 2 only by an outer edge that extends on the substrate and the first dielectric layer. As is clear from the representation in FIG. 1, this representation does not correspond to the real extension of the interlevel dielectric layers.

It becomes clear from the description in the previous paragraphs that two capacitor electrodes are provided by this trench capacitor. The parallel switching of the first, third and fifth capacitor-electrode layers 122, 126, and 130 forms a first capacitor electrode, and the parallel switching of the second and fourth capacitor-electrode layers and of the well 112 form a second capacitor electrode. Given the mentioned geometrical parameters of this capacitor structure, a very high capacitance density of about 1 micro farad per square millimeter is achieved.

The next paragraphs will turn to the via section 110 of the integration substrate. The via section 110 has a through-substrate via 162 extending from the first substrate side 1 to the second substrate side 2. The through-substrate via of this embodiment has a lateral extension w that is equal to that of the trench 119. This allows a concurrent fabrication of the trench opening 119 for the trench capacitor 118 and of a via opening 161 for the through-substrate via 162 in a single etching step. A different depth extension can be achieved by interrupting the etching process and selectively masking only the trench section 108, in order to provide a protection of the trench section 108 during a continued etching process that serves to finish the via opening to a desired depth. Note that the via opening need not be etched through the complete substrate. A later backside thinning step can be used to open the via opening.

The via is filled with a metal. Suitable metals for the via filling are Cu, Al, or an alloy of Cu and Al, but other metals can be considered as well, amongst which is tungsten (W). A via insulation layer 164 is deposited on the sidewalls of the via opening between the substrate 102 and the via filling. If Cu is used for the via filling, a diffusion barrier is also provided between the via filling and the substrate. This can be an extra diffusion barrier layer (not shown). As an alternative, a material for the via insulation layer 164 that at the same time is electrically insulating and prevents diffusion of Cu into the substrate can be used. A metallization layer 166 connects the via to a contact layer 170, which is otherwise separated from the metallization layer by a dielectric layer 166.

The active die 104 is connected with the integration substrate through a contact layer 174, a bump 172 and the contact layer 170. An electrically insulating filling 175, such as a polyimide filling is arranged between the integration substrate 102 and the active die 104.

On the second substrate side 2, a metallization layer 176 connects the through-substrate via 162 with a bump 180 for connection with another active a printed-circuit board (not shown) or another active die.

In another embodiment that is not shown in the Figs., the contact pads 150 and 160 are arranged on the second substrate side 2 and connected to the contact structures 142 to 146 and 152 to 156 by the through-substrate via 162 and a suitable arrangement metallization layers on the first and second substrate side. This way, the capacitor can be connected to circuits on a die or on a printed circuit board that faces the second substrate side 2 of the integration substrate 102.

Figure 3:
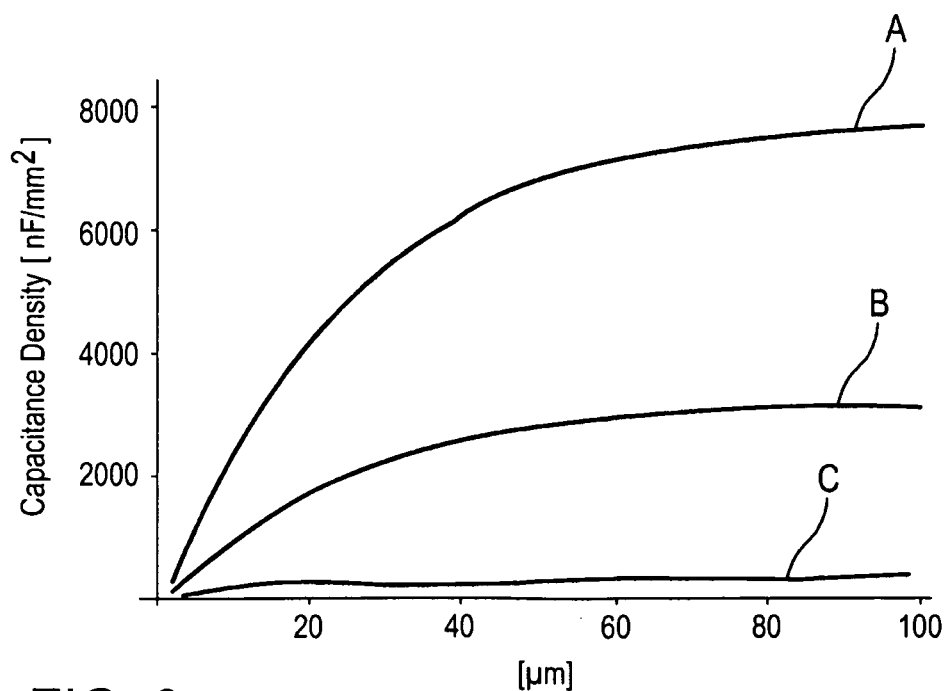
FIG. 3 shows a diagram of the capacitance density as a function of the trench radius.

FIG. 3 is a diagram showing calculations of capacitance densities that can be achieved with a trench capacitor using multiple layer stacks. In the diagram the capacitance density in units of Nano farad per square millimeter is plotted as a function of a radius of a cylindrical trench, in which the trench capacitor is formed, in units of micrometer. Three curves A, B, and C shown were calculated for three different material combinations and processes that have values of a dielectric breakdown field, which values differ by a factor of 2 for the curves A and B. The breakdown field is considered as being proportional to the inverse of the square root of the relative dielectric constant of the dielectric material used for the dielectric layers of the trench capacitor. A constant breakdown voltage of the capacitor of 30 V was used as a constraint for all three material combinations and processes. An additional constraint was used for determining the respective metal thickness for a respective material combination, namely, the constraint that the Q-factor of the trench capacitor remains the same for all three material combinations at equal height levels within the trench. Q, i.e., $1/\omega CR$, where $\omega$ denotes the angular frequency, C the capacitance, and R the resistance, changes inversely proportional to the height level as measured from the bottom of the trench.

The given assumptions and constraints allowed deriving suitable thicknesses values of the capacitor-electrode layers and dielectric layers for the trench filling, thus allowing to derive the respective capacitance densities of a trench capacitor with two capacitor electrodes distributed over the layer stack. Calculated thicknesses of the dielectric layers for the cases of a relative dielectric constant c, of 1, 10, 100, and 1000 were 15, 47.4, 150, and 474 nm, respectively. The calculated metal layer thicknesses were 16.7, 52.7, 167 and 527 nm, respectively. For the material and process combination with half the breakdown field, the resulting dielectric layer thickness values are doubled and the metal layer thickness values are decreased by a factor of 2, in comparison with the mentioned values for the case of the higher breakdown voltage, in order to maintain the Q value at equal pore-radius values. For instance, in the case of $\epsilon_r=1000$, the dielectric layer thickness is 949 nm, and the metal layer thickness is 264 nm.

The layer stacks used for the calculations in all three cases have at least three dielectric layers, thus at least four capacitor-electrode layers in the trench capacitor. The capacitor thus forms a MIMIMIM capacitor, at least, the addition of more metal layers M and more insulator layers I or, in other words, dielectric layers being possible, dependent on the given constraints, as explained.

The capacitance density represented by the three curves exhibits an approximately linear increase with increasing pore radius for radius values up to about 20 micrometer, merging into a sublinear and saturation range for higher radius values. Generally, as can be expected, the capacitance density achievable for the material and process combination with a higher breakdown field are higher. For a pore radius of 20 micrometer, the capacitance density of the material and process combination with higher breakdown field is about 4000 nF/mm$^2$ (cf. curve A), while it is at about 1500 for the material and process combination with lower breakdown field (cf. curve B). As it turns out, also the maximum achievable capacitance density in the saturation range, taken at a pore radius of approximately 100 micrometer, differs by a factor of about 2.5 between the two material combinations and processes underlying the calculation of curves A and B. Under the given constraints, the shown capacitance density curves were independent from the relative dielectric constant.

The diagram shows that capacitance densities in the range of 2000 to 4000 nF/mm$^2$ are achievable for a pore radius of approximately 20 μm. Even for lower pore-radius values in the range of 5 to 10 μm, the achievable capacitance under the mentioned constraints is higher than 1000 nF/mm$^2$.

Figure 4:
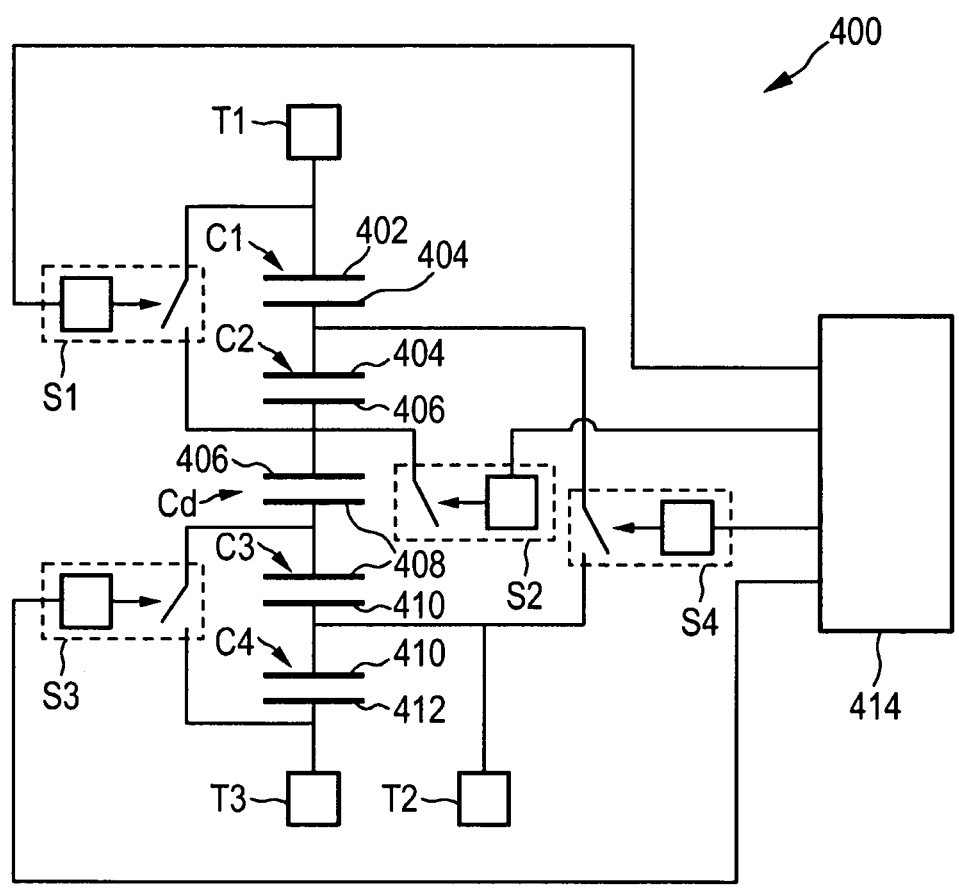
FIG. 4 shows a schematic circuit diagram representing a trench multi-capacitor device for an application as a reconfigurable capacitor that provides four different capacitance values.

FIG. 4 shows a schematic circuit diagram representing a trench multi-capacitor device in an integration substrate for an application as a reconfigurable capacitor. The illustration corresponds to a usual electric circuit diagram. However, it should be noted that this circuit diagram is provided by a trench capacitor, in which the capacitor electrodes are formed by capacitor-electrode layers. More specifically, four unit capacitors C1 to C4 are used in the present embodiment. Since in the technology described herein the top capacitor electrode of one capacitor forms the bottom electrode of the next capacitor, the individual capacitor electrodes of the capacitors C1 to C4 are labeled with reference labels for clarity. The capacitor electrodes are formed by five capacitor-electrode layers 402 to 410 of the trench filling, and by a well 412 surrounding the trench.

The illustration of FIG. 4 shows that one capacitor formed by the capacitor-electrode layers 406 and 408 is not used for the reconfigurable capacitor device 400. This unused capacitor is marked by Cd, as a dummy capacitor. The dummy capacitor Cd is not used because the combination of the capacitors C1, C2 and C3, C4 need to be isolated from each other. The reconfigurable capacitor 400 further has four switches S1 to S4. The switch S1 is interconnected between a terminal T1, which is connected with the capacitor-electrode layer 402, and the capacitor-electrode layer 406. The second switch S2 is interconnected between the capacitor-electrode layer 406 and the capacitor-electrode layer 408. The third switch S3 is interconnected between the capacitor-electrode layer 408 and a third terminal connected with the capacitor electrode formed by the well 412. The fourth switch S4 is interconnected between the second capacitor-electrode layer 404 and the capacitor-electrode layer 410. A terminal T2 is interconnected between the switch S4 and the capacitor-electrode layer 410. A control unit 414 is connected with the switches S1 to S4. The control unit 414 is configured to generate and provide to the switches S1 to S4 respective control signals for forming a respective one of a plurality of possible multi-capacitor configurations using the capacitor electrode layers 402 to 410 and the well 412. More specifically, four different multi-capacitor configurations can be made with the trench multi-capacitor device 400 of FIG. 4. The configurations are:

a) In a first configuration, the capacitors C1 to C4 are connected in series. In this configuration, switch S2 is closed and switches S1, S3, and S4 are open. The terminals T1 and T3 are used.

b) In a second multi-capacitor configuration, the capacitors C1 to C4 are connected in parallel. In this configuration, the switches S1 to S4 are closed, i.e., connecting, and the terminals T2 and either T1 or T3 are used. T1 and T3 are equivalent in this multi-capacitor configuration.

c) In a third multi-capacitor configuration, the capacitor C1 is connected in series with the capacitor C2, which is configured in series with a parallel configuration of the capacitors C3 and C4. In this multi-capacitor configuration, the switches S2 and S3 are closed, while the switches S1 and S4 are open. The terminals T1 and T2 are used.

d) In a fourth multi-capacitor configuration, the capacitor C1 is connected in series with a parallel configuration of the capacitors C2, C3, and C4. In this configuration, the switch S1 is open and the switches S2 to S4 are closed. The terminals T1 and T3 are used.

It becomes clear from the previous description that the device 400 of FIG. 4 allows to form four different capacitance values. In comparison with a situation of having four individual capacitors with different values, the trench multi-capacitor device 400 requires one connection less, namely, seven instead of eight connections.

Note that it is also possible to use all capacitors in the stack of the trench capacitor for a reconfigurable capacitor device that provides four different capacitance values.

Figure 5:
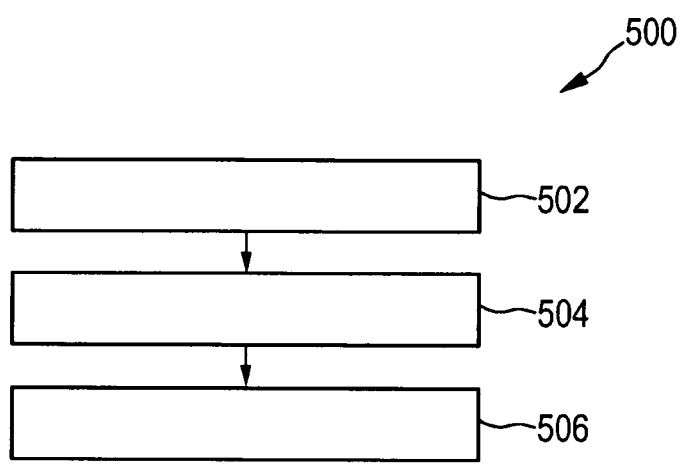
FIG. 5 shows a simplified flow diagram of a method for fabricating an integration device.

FIG. 5 shows a flow diagram of an embodiment of a process for fabricating an integration substrate. The process starts with providing a substrate with a semiconductor substrate on a first substrate side of the integration substrate (not shown). The substrate can be a high-ohmic silicon wafer preprocessed by implanting suitable wells for integration of passives.

In a subsequent processing step 502, trench openings and via openings are concurrently fabricated. The openings are in this embodiment fabricated by deep reactive ion etching through respective mask openings, which have an equal lateral extension exceeding 10 micrometer. The trenches thus extend from the first substrate side towards an opposite second substrate side of the integration substrate. As mentioned before, different depth extensions can be achieved by interrupting the etching process and selectively masking only the trench section 108, in order to provide a protection of the trench section 108 during a continued etching process that serves to finish the via opening to a desired depth. Note that the via opening need not be etched through the complete substrate. A later backside thinning step can be used to open the via opening.

After that a trench filling is fabricated in the trench capacitor by a number of masked deposition steps in a step 504. For each combination of polysilicon layer and dielectric layer in the stack, an individual mask is used. The resulting trench filling includes at least four electrically conductive capacitor-electrode layers in an alternating arrangement with dielectric layers.

The resulting layer stack is covered with an interlevel dielectric layer in a backend processing stage. Here also, in a subsequent step 506, contacts to the two capacitor terminals are fabricated and connected to capacitor terminals on the first or second substrate side for connecting the capacitor-electrode layers alternatingly to a respective one of the two capacitor terminals provided. In the backend processing also, the through-substrate via openings are filled with metal. Subsequently, the individual integration substrates are separated by dicing the wafer (not shown).

In short summary, the processing of this embodiment can be described as follows:
Step 502: concurrently form trench openings and via openings with lateral extension of at least 10 micrometer;
Step 504: fabricate trench filling for trench capacitors and via filling for through-substrate via;
Step 506: fabricate and connect capacitor terminals.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:

1. An integration device (102), the integration device comprising
a semiconductor substrate (106) with a first substrate side (1) and an opposite second substrate side (2);
a through-substrate via (162) extending from the first substrate side (1) to the second substrate side (2);
a trench capacitor (118) in the semiconductor substrate (106); wherein
the trench capacitor has a trench filling (120 to 138) that includes a number of at least four electrically conductive capacitor-electrode layers (122, 126, 130, 134, 138) in an alternating arrangement with dielectric layers (120, 124, 128, 132), such that the different capacitor-electrode layers are electrically isolated from each other;
the capacitor-electrode layers are connected to capacitor terminals (150, 160) provided on the first or second substrate side, and wherein
the trench capacitor (118) and the through-substrate via (162) are formed in respective trench (119) and via openings (161) in the semiconductor substrate, which have an equal lateral extension (w) exceeding 10 micrometer.

2. The integration device of claim 1, wherein the semiconductor substrate (106) extends from the first to the second substrate side of the integration substrate (100), and wherein the trench capacitor (118) is formed in a first doped well (112).

3. The integration device of claim 2, wherein a capacitor-electrode layer that is closest to a bottom and/or side wall of the opening is not connected to any of the capacitor terminals.

4. The integration device of claim 3, comprising a transistor, which is arranged in a second doped well (114) in the semiconductor substrate (106).

5. The integration device of claim 1, wherein the dielectric layers (120, 124, 128, 132) of the trench capacitor are made of $SiO_2$ or $Si_3N_4$ or silicon oxynitride.

6. The integration device of claim 1, wherein the capacitor-electrode layers are made of polysilicon (122, 126, 130, 134, 138).

7. The integration device of claim 1, wherein the trench capacitor and the through-substrate via are formed in respective openings (119, 161) in the semiconductor substrate, which have an equal lateral extension between 15 and 100 micrometer.

8. The integration device of claim 1, wherein the trench opening (119) has an aspect ratio defined by a ratio of a depth extension of the trench opening in a depth direction from the first (1) to the second substrate side (2) and of a lateral extension (w) in a direction parallel to a main substrate surface on the first substrate side (1), which aspect ratio is at least 2.

9. The integration device of claim 1, wherein the trench capacitor has a capacitance density of at least 500 nanofarad per square millimeter.

10. The integration device of claim 1, further comprising
a configurable trench capacitor in the semiconductor substrate; wherein
the configurable trench capacitor has a trench filling that includes a number of at least four electrically conductive capacitor-electrode layers in an alternating arrangement with dielectric layers, such that the different capacitor-electrode layers are electrically isolated from each other; and wherein
the capacitor-electrode layers are each connected to a respective allocated capacitor terminal provided on the first or second substrate side.

11. The integration device of claim 1, further comprising
a switching unit that comprises a plurality of switching elements (S1 to S7) electrically interconnected between different capacitor-electrode layers, wherein the individual switching elements are configured to electrically connect, in a first switching state, two respective capacitor-electrode layers with each other, and to electrically disconnect, in a second switching state, the same two respective capacitor-electrode layers from each other, the switching elements having a control input terminal and being configured to assume either the first or the second switching state in dependence on a switch-control signal applied to the control input terminal; and
a control unit (414), which is connected with the switching unit and which is configured to generate and provide to the switching unit respective control signals for forming a respective one of a plurality of multi-capacitor configurations (400) using the capacitor-electrode layers of the trench filling.

12. A system-in-package comprising an integration device according to claim 1.

13. A method for fabricating an integration device (100), comprising
providing a semiconductor substrate (106) with a first substrate side (1) and an opposite second substrate side;
concurrently fabricating (502) trench (119) and via openings (161) in the semiconductor substrate (106), which have an equal lateral extension (w) exceeding 10 micrometer and extend from the first substrate side (1) towards an opposite second substrate side (2) of the semiconductor substrate;
fabricating (504) a trench filling (120 to 138) in the trench capacitor that includes a number of at least four electrically conductive capacitor-electrode layers (122, 126, 130, 134, 138) in an alternating arrangement with dielectric layers (120, 124, 128, 132), such that the different capacitor-electrode layers are electrically isolated from each other;
fabricating (506) two capacitor terminals (150, 160) on the first or second substrate side and connecting the capacitor-electrode layers alternatingly to capacitor terminals provided; and
fabricating a through-substrate via the via opening (161).

14. The method of claim 13, wherein the concurrent fabrication of trench openings and via openings comprises performing a deep reactive ion etching process for forming the trench openings and the via openings.

\* \* \* \* \*